US012645142B2

(12) United States Patent
Kawato et al.

(10) Patent No.: US 12,645,142 B2
(45) Date of Patent: Jun. 2, 2026

(54) PHOTORESIST COMPOSITION, A METHOD FOR MANUFACTURING A PHOTORESIST COATING, ETCHED PHOTORESIST COATING, AND ETCHED Si CONTAINING LAYER(S), AND MANUFACTURING A DEVICE USING THEREOF

(71) Applicant: Merck Patent GmbH, Darmstadt (DE)

(72) Inventors: Shunji Kawato, Kakegawa (JP); Hiroshi Yanagita, Kakegawa (JP); Yusuke Hama, Kakegawa (JP); Takayuki Sao, Kakegawa (JP); Taku Hirayama, Tokyo (JP)

(73) Assignee: Merck Patent GmbH, Darmstadt (DE)

( * ) Notice: Subject to any disclaimer, the term of this patent is extended or adjusted under 35 U.S.C. 154(b) by 831 days.

(21) Appl. No.: 17/255,286

(22) PCT Filed: Jun. 17, 2019

(86) PCT No.: PCT/EP2019/065844
§ 371 (c)(1),
(2) Date: Dec. 22, 2020

(87) PCT Pub. No.: WO2019/243238
PCT Pub. Date: Dec. 26, 2019

(65) Prior Publication Data

US 2021/0263414 A1 Aug. 26, 2021

(30) Foreign Application Priority Data

Jun. 22, 2018 (EP) .................................... 18179342

(51) Int. Cl.

| | |
|---|---|
| ***G03F 7/039*** | (2006.01) |
| ***C08G 65/08*** | (2006.01) |
| ***C08G 65/329*** | (2006.01) |
| ***G03F 7/00*** | (2006.01) |
| ***G03F 7/004*** | (2006.01) |
| ***G03F 7/075*** | (2006.01) |
| ***G03F 7/09*** | (2006.01) |
| ***G03F 7/20*** | (2006.01) |
| ***G03F 7/30*** | (2006.01) |
| ***G03F 7/36*** | (2006.01) |
| ***G03F 7/40*** | (2006.01) |
| ***H10P 50/28*** | (2026.01) |

(52) U.S. Cl.
CPC .......... *G03F 7/0392* (2013.01); *G03F 7/0045* (2013.01); *G03F 7/0752* (2013.01); *G03F 7/094* (2013.01); *G03F 7/20* (2013.01); *G03F 7/40* (2013.01); *G03F 7/70025* (2013.01); *H10P 50/28* (2026.01); *C08G 65/08* (2013.01); *C08G 65/329* (2013.01)

(58) Field of Classification Search
CPC ........ G03F 7/0392; G03F 7/0397; G03F 7/36; C08G 65/08; C08G 65/329; H10P 50/28
See application file for complete search history.

(56) References Cited

U.S. PATENT DOCUMENTS

| | | | | |
|---|---|---|---|---|
| 3,647,443 | A * | 3/1972 | Rauner | C08G 65/3348 430/326 |
| 6,358,665 | B1 | 3/2002 | Pawlowski et al. | |
| 2002/0077493 | A1* | 6/2002 | Ohsawa | G03F 7/0045 558/47 |
| 2004/0029396 | A1* | 2/2004 | Zhang | G03F 7/38 438/748 |
| 2004/0053800 | A1* | 3/2004 | Zhang | G03F 7/0048 510/175 |
| 2004/0204328 | A1* | 10/2004 | Zhang | G03F 7/091 510/175 |
| 2005/0176605 | A1* | 8/2005 | Lassila | H01L 21/02052 510/175 |
| 2010/0183976 | A1* | 7/2010 | Wang | G03F 7/2041 430/322 |
| 2010/0183977 | A1* | 7/2010 | Wang | H01L 21/0274 430/319 |
| 2015/0370171 | A1* | 12/2015 | Lamanna | C07C 303/36 430/432 |
| 2017/0299965 | A1* | 10/2017 | Hashimoto | H01L 29/786 |
| 2017/0343897 | A1 | 11/2017 | Yonemura et al. | |
| 2018/0095363 | A1* | 4/2018 | Aqad | C07C 309/04 |
| 2021/0261814 | A1* | 8/2021 | Brusch | C08G 18/48 |

FOREIGN PATENT DOCUMENTS

| | | | |
|---|---|---|---|
| CN | 106066576 | A | 11/2016 |
| EP | 1030221 | A1 | 8/2000 |
| EP | 1806621 | A1 | 7/2007 |
| JP | 2004-020726 | A | 1/2004 |
| JP | 2006-330367 | A | 12/2006 |
| JP | 2009-093706 | A | 4/2009 |

(Continued)

OTHER PUBLICATIONS

Sigma Aldrich Product 438200.*
International Preliminary Report on Patentability received for PCT Patent Application No. PCT/EP2019/065844, mailed on Dec. 30, 2020, 9 pages.
International Search Report and Written Opinion received for PCT Patent Application No. PCT/EP2019/065844, mailed on Oct. 8, 2019, 11 pages.
Momentive.Com: “Silwet Copolymers Chameleon S0lutions”,Nov. 17, 2011 (Nov. 17, 2011), XP055621773.

*Primary Examiner* — John S. Chu
(74) *Attorney, Agent, or Firm* — Faegre Drinker Biddle & Reath LLP

(57) ABSTRACT

The present invention relates to a photoresist composition comprising a polymer(s), a photo acid generator(s), a (C) compound(s) comprising unit EO and unit PO, and a solvent(s). And the present invention relates to a method for manufacturing a photoresist coating, etched photoresist coating, and etched Si containing layer(s). And the present invention relates to a method for a a manufacturing a device.

20 Claims, No Drawings

(56) References Cited

FOREIGN PATENT DOCUMENTS

| | | | |
|---|---|---|---|
| JP | 4434492 | B2 | 3/2010 |
| JP | 2016-206673 | A | 12/2016 |
| KR | 2007-0017962 | A | 2/2007 |
| TW | 200947119 | A | 11/2009 |
| WO | 2018/069274 | A1 | 4/2018 |

* cited by examiner

PHOTORESIST COMPOSITION, A METHOD FOR MANUFACTURING A PHOTORESIST COATING, ETCHED PHOTORESIST COATING, AND ETCHED Si CONTAINING LAYER(S), AND MANUFACTURING A DEVICE USING THEREOF

CROSS-REFERENCE TO RELATED APPLICATIONS

This application is a national stage application (under 35 U.S.C. § 371) of PCT/EP2019/065844, filed Jun. 17, 2019, which claims benefit of European Application No. 18179342.3, filed Jun. 22, 2018, both of which are incorporated herein by reference in their entirety.

FIELD OF THE INVENTION

The present invention relates to a photoresist composition comprising a polymer(s), a photo acid generator(s), a (C) compound(s) comprising unit EO and unit PO, and a solvent(s). And the present invention relates to a method for manufacturing a photoresist coating, etched photoresist coating, and etched Si containing layer(s). And the present invention relates to a method for manufacturing devices.

BACKGROUND ART

Because there is a tendency to require more miniaturized apparatuses with higher performance, more fine patterning is required in devices (for example, semiconductor devices, FPD devices). Lithography technology using a photoresist (can be called just "resist") is known for fine processing. For example, a chemically amplified positive tone photoresist composition comprises a polymer (resin component), solubility of which in an alkali aqueous solution increases by the action of an acid, and a photo acid generator which generates an acid when exposed to light. Upon forming a photoresist pattern, when the acid is generated by the photo acid generator, the exposed portion becomes alkali-soluble.

Generally, a coating (film) obtained by lithography technology can be classified into a so-called thin film resist of about 50-900 nm and a thick film resist of ≥1 μm. Because of the thickness difference between them, the design concepts of them are sometime different each other, for example a required level for crack reduction is different. The thick film resist is used for manufacturing semiconductor devices, micromachines, implant masks and the like.

Under these circumstances, a specific positive tone photosensitive resin composition including polymer, specific polyether resin, a component generating acid and organic solvent was studied, for attempting problem of an adhesion to a substrate, sensitivity and resolution (Patent Literature 1). This photosensitive resin was made to a thick film resist.

And, it was studied that a chemically amplified radiation sensitive composition containing a hydroxystyrene resin and an onium salt precursor which generates a fluorinated alkanesulfonic acid as a photoacid generator, wherein the photoacid generator is a sulfonium or iodonium salt of a fluorinated alkane sulfonic acid (Patent Literature 2).

PATENT LITERATURE

1. JP2006-330367A
2. JP4434492B

SUMMARY OF THE INVENTION

Technical Problem

The inventors have found that there are still one or more considerable problems for which improvement are desired, as listed below; reducing cracks in the photoresist coating and/or resist patterns; reducing residues in the photoresist coating and/or resist patterns; good solubility of the solid components in the photoresist composition; good flexibility of the photoresist coating and/or resist patterns; high yield to obtain the photoresist coating and/or resist patterns; thick coating can be made; good pattern shapes of the photoresist patterns; good reduced line width roughness of the photoresist patterns; good etching resistance of the photoresist coating and/or resist patterns; or good storage stability (preferably long-term storage stability). And good sensitivity of the photoresist coating; good resolution of the photoresist coating are also desired.

Then, the inventors found that the invention described below solves at least one of these problems.

Solution to Problem

One aspect of this invention provides a photoresist composition comprising (A) a single or a plurality of polymer whose solubility changes under the existence of acid (preferably the solubility increases in an alkaline aqueous solution), (B) a single or a plurality of photo acid generator, (C) a single or a plurality of compound comprising unit EO and unit PO, and (D) a single or plurality of solvent, wherein the unit EO is represented by following formula (1), formula (1)

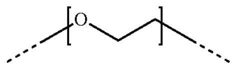

and the unit PO is represented by following formula (2).

formula (2)

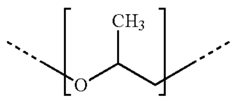

As one preferable embodiment, (C) a single or a plurality of compound is a plasticizer.

As one preferable embodiment, the (A) polymer comprises unit 1 represented by below formula (3), unit 2 represented by below formula (4) and/or unit 3 represented by below formula (5), and preferably the weight average molecular weight of the (A) polymer is 3,000-100,000.

formula (3)

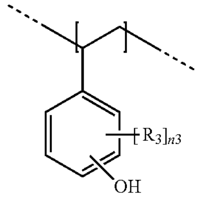

$R_3$ is each independently $C_{1-10}$ alkyl or $C_{1-10}$ alkoxyl, and n3 is 0, 1, 2, 3 or 4.

formula (4)

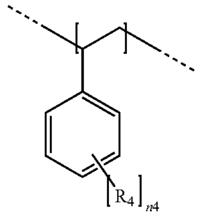

$R_4$ is each independently $C_{1-10}$ alkyl or $C_{1-10}$ alkoxyl in which $—CH_2—$ can be replaced by —O—, and n4 is 0, 1, 2, 3, 4 or 5.

formula (5)

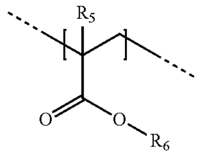

$R_5$ is hydrogen or $C_{1-10}$ alkyl, $R_6$ is $C_{1-20}$ alkyl which optionally make hydrocarbon ring.

The present invention also provides a method for manufacturing a photoresist coating, comprising: applying the photoresist composition above a single or a plurality of Si containing layer (preferably above the top of the plurality of Si containing layers); and curing the applied photoresist composition to form the photoresist coating.

As one embodiment, the present invention provides a method for manufacturing a photoresist coating, comprising: applying the photoresist composition above a plurality of Si containing layers, the Si containing layers comprise a plurality of species, at least one species of Si containing layer is conductive, and at least one species of Si containing layer is electrically insulative.

The present invention also provides a method for manufacturing an etched photoresist coating, comprising: manufacturing the photoresist coating; exposing (preferably exposing with 12.0-260 nm wavelength light) the photoresist coating; developing the photoresist coating; and (step 1) etching (preferably isotropic etching) the developed photoresist coating.

The present invention also provides a method for manufacturing a single or plurality of etched Si containing layer, comprising: manufacturing an etched photoresist coating; and (step 2) etching (preferably anisotropic etching) the Si containing layer(s).

As one embodiment, the present invention provides a method for manufacturing devices (preferably semiconductor devices) comprising the method described above.

Effects of the Invention

Crack and residue can be reduced on the photoresist coating and patterns made from the photoresist composition. The photoresist coating made from the photoresist can exhibit good flexibility. Because the residue on the photoresist coating and the photoresist patterns can be reduced, high yield can be gained.

Those are advantageous in making a resist film, preferably a thick film resist. The solid components in the photoresist composition can exhibit good solubility in the solvent(s). The sensitivity and/or resolution of the photoresist coating can be good.

The photoresist patterns made from the photoresist coating can have good pattern shapes and reduced line width roughness. The photoresist coating can have a good etching (preferably dry etching) resistance. The photoresist coating can have a good sensitivity. The photoresist coating can have a good resolution.

Definitions

The above outlines and the following details are for describing the present invention, and are not for limiting the claimed invention. Unless otherwise stated, the following terms used in the specification and claims shall have the following meaning for the purpose of this Application.

In this application, the use of the singular includes the plural, and the words “a”, “an” and “the” mean “at least one”, unless specifically stated otherwise. In this specification, when one concept component can be exhibited by plural species, and when its amount (e.g. mass %, mol %) is described, the amount means the total amount of them, unless specifically stated otherwise.

Furthermore, the use of the term “including”, as well as other forms such as “includes” and “included”, is not limiting. Also, terms such as “element” or “component” encompass both elements or components comprising one unit and elements or components that comprise more than one unit, unless specifically stated otherwise. As used herein, the term “and/or” refers to any combination of the elements including using a single element.

In the present specification, when the numerical range is shown using “to”, “-” or ~the numerical range includes both numbers before and after the “to”, “-” or “~”, and the unit is common for the both numbers, unless otherwise specified. For example, 5 to 25 mol % means 5 mol % or more and 25 mol % or less.

As used herein, “$C_{x-y}$”, “$C_x$-$C_y$” and “$C_x$” designate the number of carbon atoms in a molecule. For example, $C_{1-6}$ alkyl chain refers to an alkyl chain having a chain of between 1 and 6 carbons (e.g., methyl, ethyl, propyl, butyl, pentyl and hexyl). The section headings used herein are for organizational purposes and are not to be construed as limiting the subject matter described. All documents, or portions of documents, cited in this application, including, but not limited to, patents, patent applications, articles, books, and treatises, are hereby expressly incorporated herein by reference in their entirety for any purpose. In the event that one or more of the incorporated literature and similar materials defines a term in a manner that contradicts the definition of that term in this application, this application controls.

DETAILED DESCRIPTION OF THE INVENTION

The above summary and the following details are provided for illustration purposes, and are not intended to limit the claimed invention.

According to the present invention, it is provided that a photoresist composition comprising (A) a single or a plurality of polymer whose solubility changes under the existence of acid, (B) a single or a plurality of photo acid generator, (C) a single or a plurality of compound comprising unit EO and unit PO, and (D) a single or plurality of solvent.

It is preferable that the photoresist composition is a chemically amplified composition which comprises above said (A) polymer and a (B) photo acid generator (hereinafter often referred to as "PAG"), because it can exhibit high photosensitivity and high resolution. Upon exposure, this PAG releases an acid which catalyzes a photoresist coating dissolution reaction. It is preferable embodiment that the photoresist composition is a positive tone chemically amplified photoresist composition.

Polymer

According to the present invention, the photoresist composition comprises (A) a single or a plurality of polymer whose solubility changes under the existence of acid. As preferably embodiment, the (A) polymer reacts with an acid to increase its solubility in an alkaline aqueous solution (preferably 2.38 mass % TMAH solution).

Such polymer has, for example, an acid group protected by a protective group, and when an acid is added from the outside, its protective group is eliminated and the solubility in an alkaline aqueous solution increases. Such polymer can be selected from known polymer in lithography field.

As one preferable embodiment, the (A) polymer comprises unit 1 represented by below formula (3), unit 2 represented by below formula (4) and/or unit 3 represented by below formula (5).

formula (3)

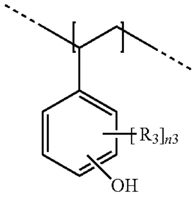

;

formula (4)

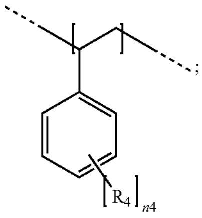

;

formula (5)

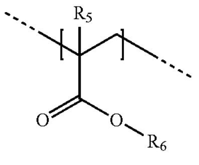

Unit 1 is represented by below formula (3).

formula (3)

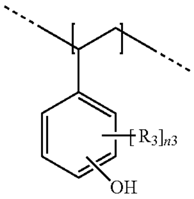

$R_3$ is each independently $C_{1-10}$ alkyl or $C_{1-10}$ alkoxyl. $R_3$ is each independently preferably methyl, ethyl, isopropyl, t-butyl, methoxy ($CH_3$—O—), ethoxy, isopropoxy or t-butoxy, more preferably methyl, ethyl, isopropyl, t-butyl, methoxy or ethoxy, further preferably methyl, t-butyl or methoxy.

n3 is 0, 1, 2, 3 or 4. n3 is preferably 0, 1 or 2, more preferably 0 or 1, further preferably 0.

It is a preferable embodiment that —OH bonds to para position at the phenyl

Unit 2 is represented by below formula (4).

formula (4)

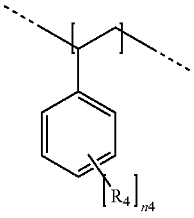

$R_4$ is each independently $C_{1-10}$ alkyl or $C_{1-10}$ alkoxyl in which —$CH_2$— can be replaced by —O—. $R_4$ is each independently preferably methyl, ethyl, isopropyl, t-butyl, methoxy, ethoxy, isopropoxy or t-butoxy, more preferably methyl, ethyl, isopropyl, t-butyl, methoxy or ethoxy, further preferably methyl, t-butyl or methoxy. Preferably 0 or 1 of —$CH_2$— in $C_{1-10}$ alkoxyl of $R_4$ can be replaced by —O—, more preferably 0 (none of —$CH_2$— in $C_{1-10}$ alkoxyl of $R_4$ is replaced by —O—).

n4 is 0, 1, 2, 3, 4 or 5. n4 is preferably 0, 1 or 2, more preferably 0 or 1, further preferably 0.

Unit 3 is represented by below formula (5).

formula (5)

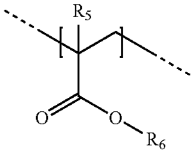

$R_5$ is hydrogen or $C_{1-10}$ alkyl. $R_5$ is preferably hydrogen, methyl, ethyl, isopropyl or t-butyl, more preferably hydrogen, methyl or t-butyl, further preferably hydrogen or methyl, even preferably hydrogen.

$R_6$ is $C_{1-20}$ alkyl which optionally make hydrocarbon ring. The $C_{1-20}$ alkyl is preferably liner or branched. It is a preferable embodiment that the $C_{1-20}$ alkyl optionally make hydrocarbon ring (more preferably non-aromatic ring). Any combination of any of liner alkyl, branched alkyl and hydrocarbon ring can be used as $C_{1-20}$ alkyl of $R_6$. $R_6$ is preferably methyl, ethyl, isopropyl, t-butyl, cyclopentyl, cyclohexyl, ethyl-cyclopentyl, ethyl-cyclohexyl or adamantyl-ethyl, more preferably methyl, isopropyl, t-butyl, ethyl-cyclopentyl, ethyl-cyclohexyl or adamantyl-ethyl, further preferably t-butyl, ethyl-cyclopentyl, ethyl-cyclohexyl, adamantyl-ethyl, evenp referably t-butyl.

It is preferable that the (A) polymer is copolymer comprising at least 2 units of unit 1, 2 and 3. It is more preferable that the (A) polymer is copolymer comprising unit 1, 2 and 3. Alternating copolymerization, random copolymerization or block copolymerization of them are preferable. Random copolymerization or block copolymerization of them are more preferable. Random copolymerization of them are further preferable. The photoresist coating made from the composition comprise (A) copolymer can exhibit reducing cracks, even with a severe condition.

In the (A) polymer, repeating number of Unit 1, Unit 2 and Unit are each $RN_{unit1}$, $RN_{unit2}$ and $RN_{unit3}$ in this specification. It is preferable that $RN_{unit1}$, $RN_{unit2}$ and $RN_{unit3}$ satisfy below formula.

$$RN_{unit1}/(RN_{unit1}+RN_{unit2}+RN_{unit3})=40\text{-}80\%,$$

$$RN_{unit2}/(RN_{unit1}+RN_{unit2}+RN_{unit3})=3\text{-}40\%, \text{ and/or}$$

$$RN_{unit3}/(RN_{unit1}+RN_{unit2}+RN_{unit3})=10\text{-}40\%.$$

$RN_{unit1}/(RN_{unit1}+RN_{unit2}+RN_{unit3})$ is more preferably 50-80%, further preferably 55-75%, further more preferably 60-70%.

$RN_{unit2}/(RN_{unit1}+RN_{unit2}+RN_{unit3})$ is more preferably 3-30%, further preferably 5-25%, further more preferably 10-20%.

$RN_{unit3}/(RN_{unit1}+RN_{unit2}+RN_{unit3})$ is more preferably 10-25%, further preferably 12-25%, further more preferably 10-20%.

(A) polymer can comprise further repeating unit differing from Unit 1, Unit 2 and Unit 3. Total repeating unit number in (A) polymer is $RN_{total}$ in this specification. It is preferable that $RN_{total}$ satisfy below formula.

$$(RN_{unit1}+RN_{unit2}+RN_{unit3})/RN_{total}=80\text{-}100\%.$$

$(RN_{unit1}+RN_{unit2}+RN_{unit3})/RN_{total}$ is more preferably 90-100%, further preferably 95-100%. It is one preferable embodiment of the invention that $(RN_{unit1}+RN_{unit2}+RN_{unit3})/RN_{total}$ is 100%, which measn no other repeating unit is comprised in the (A) polymer.

Exemplified embodiments of (A) polymer are described below, but only for illustrative purpose.

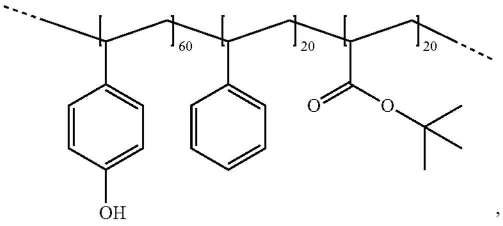

,

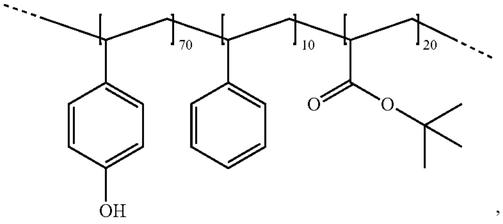

,

-continued

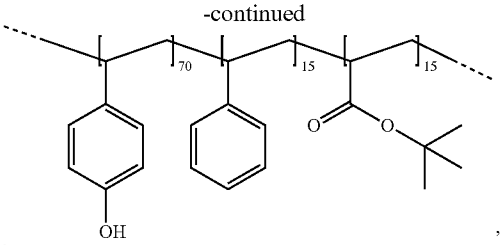

,

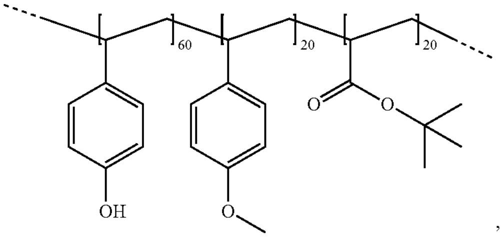

,

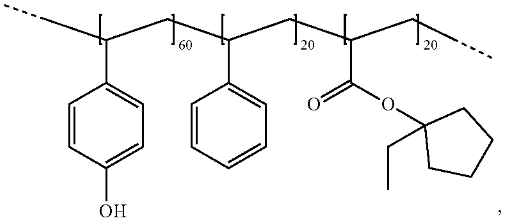

,

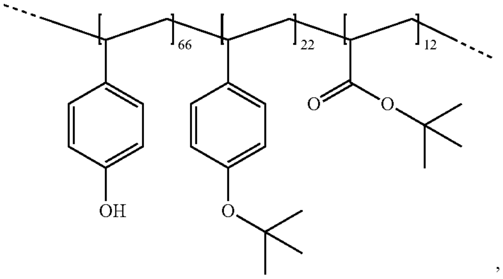

,

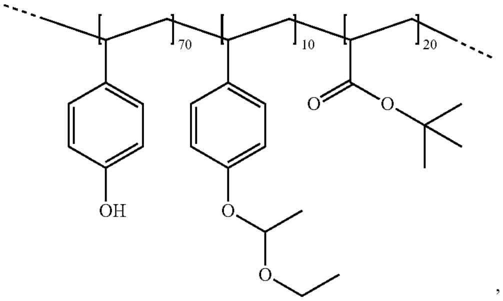

,

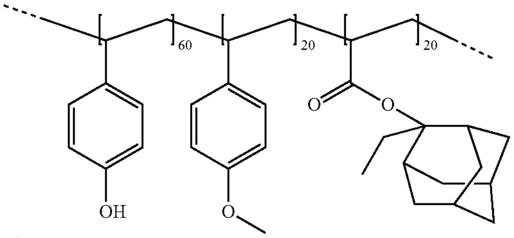

,

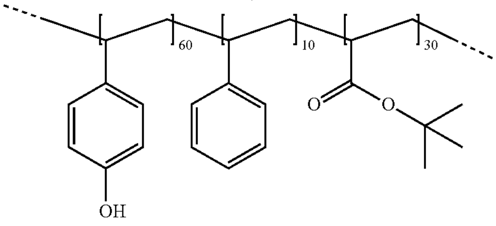

A single or a plurality of (A) polymers can be used in the present photoresist composition. For example, combination of below 2 (A) polymers can be used in 1 photoresist composition.

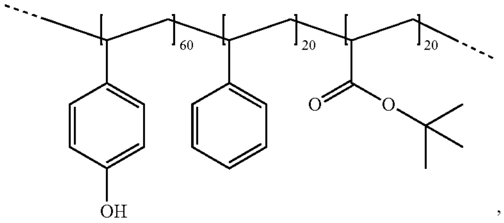

,

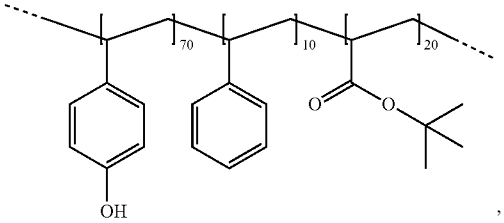

,

In the present application, the weight average molecular weight (Mw) can be measured by gel permeation chromatography (GPC). In a suitable example of this measurement, a GPC column is set to 40 degrees Celsius; 0.6 mL/min of tetrahydrofuran is used as an elution solvent; and monodisperse polystyrene is used as a standard.

As one aspect of the invention, the weight average molecular weight (Mw) of the (A) polymer of the photoresist composition is preferably 3,000 to 100,000, more preferably 5,000 to 50,000, further preferably 5,000 to 20,000, even preferably 8,000 to 18,000.

As one embodiment, the mass ratio of the (A) polymer to the total mass of the photoresist composition is preferably 5-50 mass %, more preferably 10-45 mass %, further preferably 20-42 mass %, even preferably 25-40 mass %, particularly preferably 33-38 mass %.

Photo Acid Generator

According to the present invention, the photoresist composition comprises (B) a single or a plurality of photo acid generator. The (B) PAG generates acid due to light exposure.

As preferable embodiment of the photoresist composition, the (B) photo acid generator comprises at least one selected from the group consisting of sulfonic acid derivative, diazomethane compound, onium salt, sulfone imide compound, disulfonic compound, nitrobenzyl compound, benzoin tosylate compound, iron arene complex compound, halogen-containing triazine compound, acetophenone derivative, and cyano-containing oxime sulfonate Exemplified embodiments of (B) PAG are described below, but only for illustrative purpose.

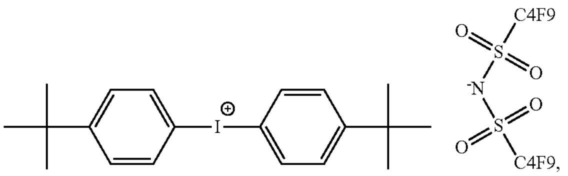

-continued

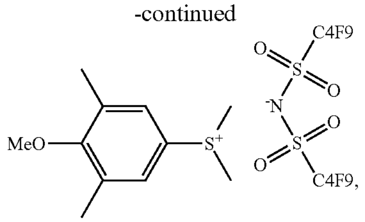

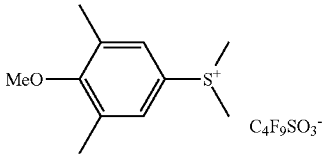

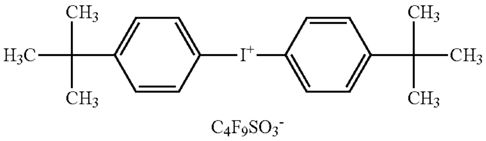

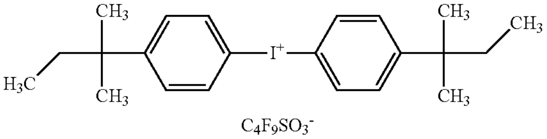

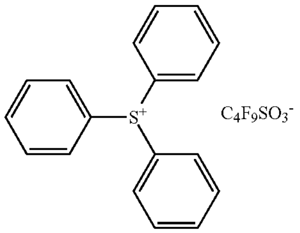

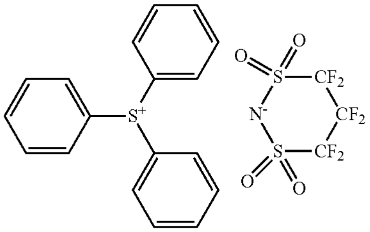

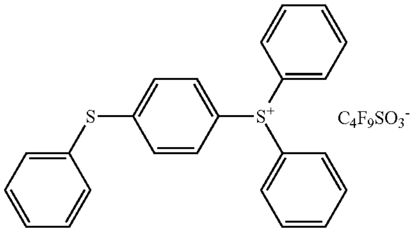

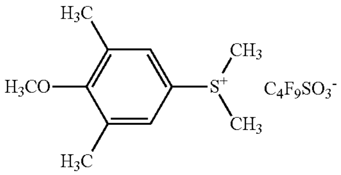

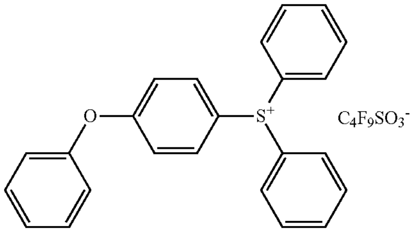

-continued
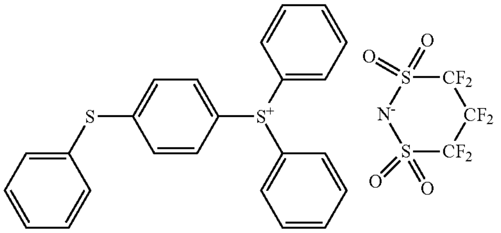
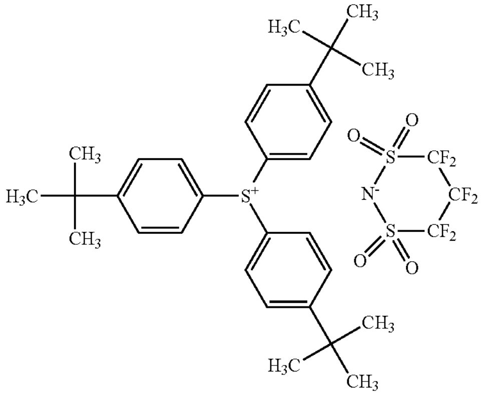
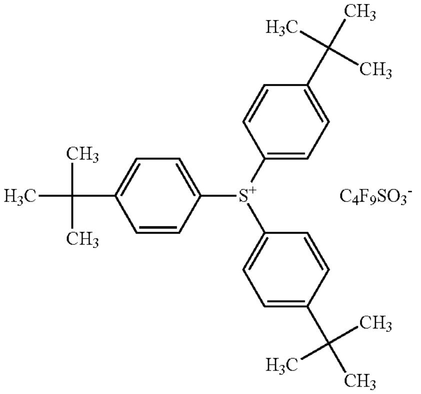
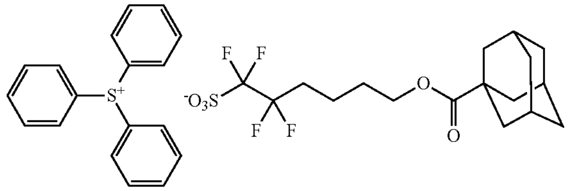
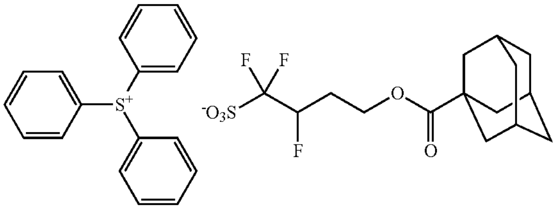
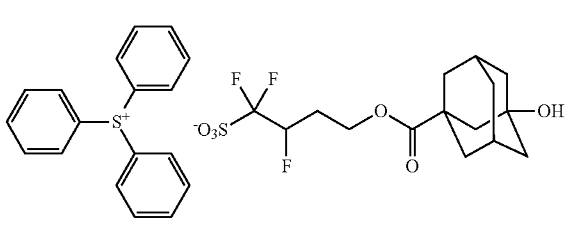
-continued
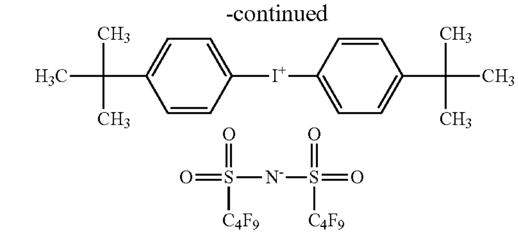
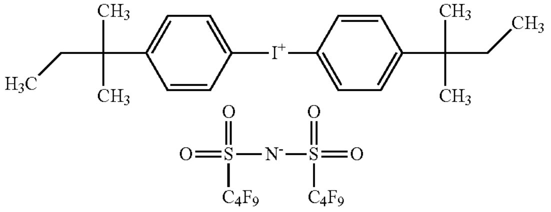
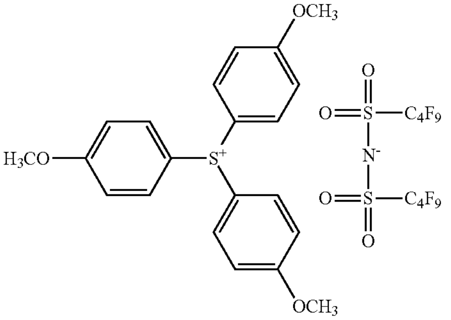
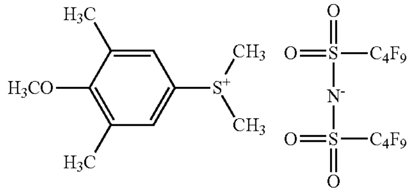
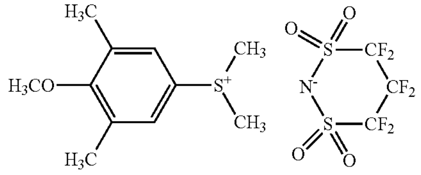
A single or a plurality of (B) PAGs can be used in the present photoresist composition. For example, combination of below 2 (B) PAGs can be used in 1 photoresist composition.
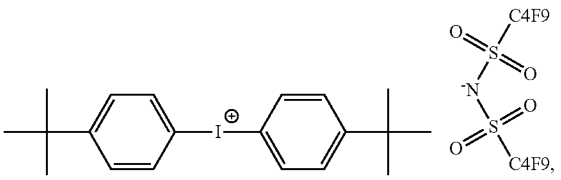
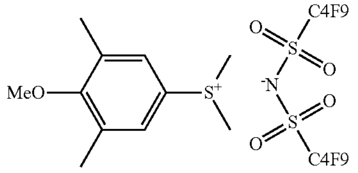
As one embodiment of the photoresist composition, the mass ratio of the (B) PAG to the mass of the (A) polymer is preferably 0.10-8 mass %, more preferably 0.5-5 mass %, further preferably 0.7-4 mass %, even preferably 1.0-3.5 mass %, particularly preferably 1.0-3 mass %, very particularly preferably 1.0-2.0 mass %.

(C) compound

According to the present invention, the photoresist composition comprises (C) a single or a plurality of compound comprising unit EO and unit PO.

The unit EO is represented by following formula (1), formula (1)

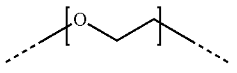

and the unit PO is represented by following formula (2).

formula (2)

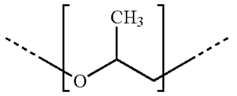

As one preferable embodiment, (C) a single or a plurality of compound is a plasticizer. The (C) compound(s) can function to reduce the brittleness of the photoresist coating (the film mainly constituted by polymer (A)) and to optimize the adhesion on the underneath layer or a substrate. In the case that the photoresist coating is thick (e.g., 0.5-200 μm), the (C) compound can give flexibility of the photoresist coating and reduce crack in the coating.

As one preferable embodiment, the (C) compound comprises a copolymer comprising both unit EO and unit PO, or the (C) compound is a plurality of compounds in which at least one compound comprised unit EO and at least one compound comprises unit PO.

The inventors thought the photoresist composition which can exhibit reducing crack and residue is good for photoresist, in particular for thick film resist. They thought that in general, the more coating is thick, the more frequently crack can happen. In the case there are many residues on the photoresist coatings/patterns, the yield will be low.

Without wishing to be bound by theory, it is believed that unit EO is good at molecular rotation to give flexibility of the photoresist coating, but unit EO interact (e.g., hydrogen bond) with (A) polymer (e.g., at water-soluble group, hydroxyl group) to be insolubilized residue.

Without wishing to be bound by theory, it is believed that unit PO is less good at molecular rotation. Unit PO contributes to the flexibility of the photoresist coating less than unit EO. But unit PO is believed that it less interacts with (A) polymer, then unit PO can reduce insolubilized residue in the coating.

It is one embodiment of the photoresist composition that the (C) compound comprises a copolymer comprising both unit EO and unit PO.

It is preferable that the (C) compound comprises a copolymer at least one selected from the group consisting of random copolymer, block copolymer, alternating copolymer, graft copolymer and combination of any of these, preferably random copolymer and/or block copolymer, more preferably random copolymer.

It is another embodiment of the photoresist composition that the (C) compound is a plurality of compounds in which at least one compound comprised unit EO and at least one compound comprises unit PO. Co-existence of unit EO and unit PO can cause above mentioned good properties of the photoresist composition and the photoresist coating.

In the case one (C) compound doesn't comprise unit PO but unit EO, the weight average molecular weight (Mw) of unit EO based on the composition is preferably 75-99.999%, more preferably 80-99.999%, further preferably 85-99.999%, even preferably 90-99.99%.

In the case one (C) compound doesn't comprise unit EO but unit PO, the weight average molecular weight (Mw) of unit PO based on the composition is preferably 75-99.999%, more preferably 80-99.999%, further preferably 85-99.999%, even preferably 90-99.99%.

In the case one (C) compound comprises both unit EO and unit PO, the weight average molecular weight (Mw) of sum of unit EO and unit PO based on the composition is preferably 75-99.999%, more preferably 80-99.999%, further preferably 85-99.999%, even preferably 90-99.99%.

It is one embodiment of the photoresist composition that the terminals of the (C) compound comprising unit EO are modified by $R_1$****— and $R_2$—O—, and the terminals of the (C) compound comprising unit PO are modified by $R_1'$— and $R_2'$—O—.

$R_1$, $R_2$, $R_1'$ and $R_2'$ are each independently hydrogen or $C_{1-10}$ alkyl. The $C_{1-10}$ alkyl of $R_1$, $R_2$, $R_1'$ and $R_2'$ can each independently be linear or branched alkyl. The $C_{1-10}$ alkyl of $R_1$, $R_2$, $R_1'$ and $R_2'$ are preferably methyl, ethyl, propyl, isopropyl, butyl, t-butyl, pentyl or hexyl, more preferably methyl, ethyl, propyl, butyl, pentyl or hexyl, further preferably methyl, ethyl, propyl or butyl, even preferably butyl. It is one preferable embodiment that $R_1$ and $R_1'$ each independently hydrogen or butyl, more preferably hydrogen. It is one preferable embodiment that $R_2$ and $R_2'$ are hydrogen.

In the case one (C) compound comprises both unit EO and unit PO, the terminals of the (C) compound are modified by $R_1$— and $R_2$—O—.

It is one embodiment of the photoresist composition that the molecular ratio of [(unit EO) compare to combination of (unit EO and unit PO)] in the (C) compound(s) is preferably 10-90 mol %, more preferably 20-80 mol %, further preferably 23-77 mol %, even preferably 25-75/mol %. As above mentioned, keeping certain balance of molecular ratio of unit EO and unit PO is preferable to accomplish reducing crack and residue of the photoresist coating/patterns.

As one another aspect, it is also one embodiment of the photoresist composition that molecular ratio of [(unit EO)/(unit PO)] in the (C) compound(s) is preferably 10/90 to 90/10, more preferably 20/80 to 80/20, further preferably 23/77 to 77/23, even preferably 25/75 to 75/25.

It is one embodiment of the photoresist composition that the weight average molecular weight (Mw) of the (C) compound(s) is preferably 1,000-50,000, more preferably 1,500-30,000, further preferably 1,800-25,000, even preferably 3,000 to 21,000.

Exemplified embodiments of (C) compounds are described below, but only for illustrative purpose.

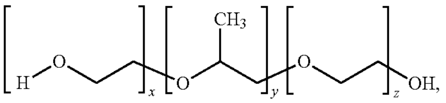

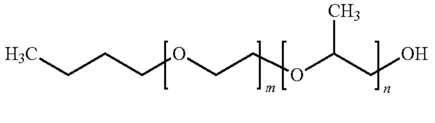

-continued

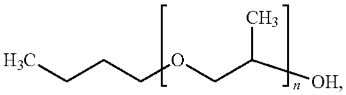

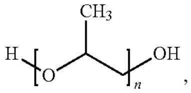

,

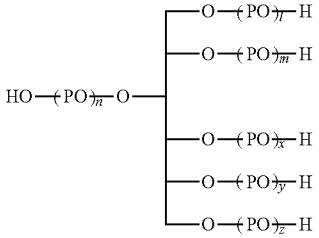

PO: Propylene oxide

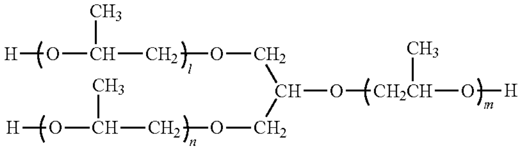

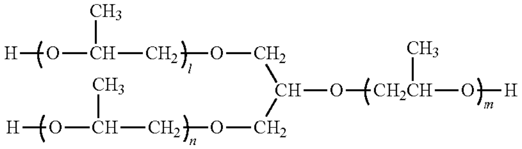

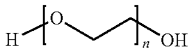

A single or a plurality of (C) compounds can be used in the present photoresist composition. For example, combination of below 2 (C) compounds can be used in 1 photoresist composition.

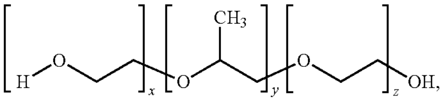

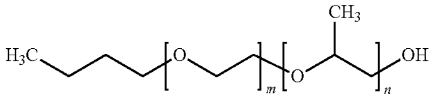

Another example of the combination of 2 (C) compounds are below.

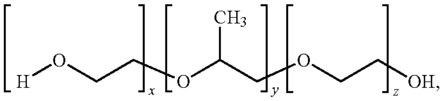

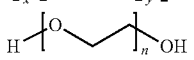

The other example of the combination of 2 (C) compounds are below. As one embodiment of this invention, each of below 2 (C) compounds is a plasticizer.

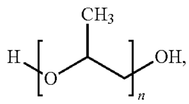

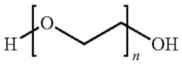

The (C) compound can be synthesized with known method for example described on "Acidity Removal and Cesium Catalyst Recovery from Polyol Synthesis Process" Maria M. Velencoso et al., Org. Process Res. Dev., 2013, 17 (5), pp 792-797. For example, the (C) compound can be obtained from Sigma-Aldrich Co. LLC.

As one embodiment of the photoresist composition, the mass ratio of the (C) compound to the mass of the (A) polymer preferably is 0.1-50 mass %, more preferably 3-50 mass %, further preferably 3-30 mass %, further more preferably 4-20 mass %, even preferably 5-17 mass %, particularly preferably 8-17 mass %, further particularly preferably 12-17 mass %.

Solvent

According to the present invention, the photoresist composition comprises (D) a single or a plurality of solvent. The solvent can be water or organic solvent, preferably organic solvent.

It is one embodiment of the photoresist composition that the (D) solvent comprises at least one selected from the group consisting of aliphatic hydrocarbon solvent, aromatic hydrocarbon solvent, monoalcohol solvent, polyol solvent, ketone solvent, ether solvent, ester solvent, nitrogen-containing solvent, and sulfur-containing solvent. Any combination of any of these organic solvents can be used. Examples of the organic solvents include: aliphatic hydrocarbon solvents such as n-pentane, i-pentane, n-hexane, i-hexane, n-heptane, i-heptane, cyclohexane, and methylcyclohexane; aromatic hydrocarbon solvents such as benzene, toluene, xylene, ethylbenzene, trimethylbenzene, methylethylbenzene, n-propylbenzene, i-propylbenzene, diethylbenzene, and i-butylbenzene,; monoalcohol solvents such as methanol, ethanol, n-propanol, i-propanol, n-butanol, i-butanol, sec-butanol, t-butanol, n-pentanol, i-pentanol, 2-methylbutanol, 2-ethylhexanol, n-nonyl alcohol, 2,6-dimethylheptanol-4, n-decanol, cyclohexanol, benzyl alcohol, phenylmethylcarbinol, diacetone alcohol, and cresol; polyol solvents such as ethylene glycol, propylene glycol, 1,3-butylene glycol, diethylene glycol, dipropylene glycol, triethylene glycol, tripropylene glycol, and glycerin; ketone solvents such as acetone, methyl ethyl ketone, methyl n-propyl ketone, methyl n-butyl ketone, diethyl ketone, trimethylnonanone, cyclohexanone, cyclopentanone, methylcyclohexanone, 2,4-pentanedione, acetonylacetone, acetophenone, and fenchone; ether solvents such as ethyl ether, i-propyl ether, n-butyl ether (dibutyl ether, DBE), n-hexyl ether, 2-ethylhexyl ether, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, propylene glycol monomethyl ether (PGME), propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyltetrahydrofuran; ester solvents such as diethyl carbonate, methyl acetate, ethyl acetate, γ-butyrolactone, γ-valerolactone, n-propyl acetate, i-propyl acetate, n-butyl acetate (nBA), i-butyl acetate, n-butyl propionate, methyl lactate, ethyl lactate (EL), γ-butyrolactone, n-butyl lactate, n-amyl lactate, diethyl malonate, dimethyl phthalate, diethyl phthalate, propylene glycol 1-monomethyl ether 2-acetate (PGMEA), propylene glycol monoethyl ether acetate, and propylene glycol monopropyl ether acetate; nitrogen-containing solvents such as N-methylformamide; and sulfur-containing solvents such as dimethyl sulfide. Any mixture of any of these solvents can also be used.

In terms of the storage stability of the solution, cyclohexanone, cyclopentanone, propylene glycol monomethyl ether, propylene glycol monoethyl ether, propylene glycol monopropyl ether, propylene glycol monobutyl ether, propylene glycol dimethyl ether, propylene glycol diethyl ether, propylene glycol 1-monomethyl ether 2-acetate, propylene glycol monoethyl ether acetate, propylene glycol monopropyl ether acetate, γ-butyrolactone, ethyl lactate, and any mixture of any of these are preferred.

As (D) solvent according to the invention, PGME, PGMEA, EL, nBA, DBE, and any mixture of any of these are preferable embodiments. If mixture of 2 species of solvent, mass ratio of the $1^{st}$ solvent and $2^{nd}$ solvent is preferably 95:5-5:95 (more preferably 90:10-10:90, further preferably 80:20-20:80). If mixture of 3 spicies of solvents, mass ratio of the $1^{st}$ solvent and sum of solvent is preferably 30-90% (more preferably 50-80%, further preferably 60-70%), mass ratio of the $2^{nd}$ solvent and sum of solvent is preferably 10-50% (more preferably 20-40%), and mass ratio of the $3^{rd}$ solvent and sum of solvent is preferably 5-40% (more preferably 5-20%, further preferably 5-15%), In terms of the solubility of the solute, propylene glycol monomethyl ether, propylene glycol 1-monomethyl ether 2-acetate, ethyl lactate, and a mixture of any two solvents selected therefrom are preferred. For this aspect, a mixture of propylene glycol monomethyl ether and propylene glycol 1-monomethyl ether 2-acetate is more preferable as solvent.

The amount of the (D) solvents (or the total amount of plurality of (D) solvents) is preferably 50-95 mass % (more preferably 50-85 mass %, further preferably 55-80 mass %, even preferably 55-75 mass %) relative to the total mass of the photoresist composition. Because the photoresist coating can reduce crack, solid components amount can be increased in the photoresist composition and photoresist coating can be thickened.

The (D) solvents preferably comprise an organic solvent, and the amount of water in the photoresist composition is preferably 0.1 mass % or less, further preferably 0.01 mass % or less. Given the relationship with another layer or coating, it is preferable for the (D) solvents to be free of water. As one aspect of the present invention, the amount of water in the photoresist composition is preferably 0.00 mass %.

Base

The photoresist composition can further comprise (E) a single or plurality of base.

The (E) base has an effect of suppressing diffusion of the acid generated in the exposed part and that of suppressing acid deactivation of the film surface by the amine component contained in air by adding (E) base to the composition.

Examples of such (E) base organic compound include:

(i) ammonia;

(ii) $C_{1-16}$ primary aliphatic amines, such as methylamine, ethylamine, isopropylamine, tert-butylamine, cyclohexylamine, ethylenediamine and tetraethylenediamine, and derivatives thereof. n-Octan-1-amine is another preferable embodiment;

(iii) $C_{2-32}$ secondary aliphatic amine, such as dimethylamine, diethylamine, methylethylamine, dicyclohexylamine and N,N-dimethylmethylenediamine, and derivatives thereof;

(iv) $C_{3-48}$ tertiary aliphatic amines, such as trimethylamine, triethylamine, dimethylethylamine, tricyclohexylamine, N,N,N',N'-tetramethylethylenediamine, N,N,N',N",N"-pentamethyldiethylenetriamine, tris[2-(dimethylamino)ethyl]amine and tris[2-(2-methoxyethoxy)ethyl]amine, and derivatives thereof;

(v) $C_{6-30}$ aromatic amines, such as aniline, benzylamine, naphthylamine, N-methylaniline, 2-methylaniline, 4-aminobenzoic acid and phenylalanine, and derivatives thereof;

(vi) $C_{5-30}$ heterocyclic amines, such as pyrrole, oxazole, thiazole, imidazole, 4-methylimidazole, pyridine and methylpyridine, and derivatives thereof. 1,8-Diazabicyclo[5.4.0]-7-undecene, 1,5-Diazabicyclo[4.3.0]non-5-ene, 7-Methyl-1,5,7-triazabicyclo[4.4.0]dec-5-ene, and 1,5,7-Triazabicyclo[4.4.0]dec-5-ene are other preferable embodiments.

Exemplified embodiment of (E) base is described below, but only for illustrative purpose.

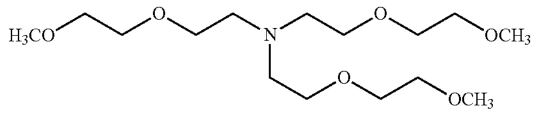 [SMILES: COCCOCCN(CCOCCOC)CCOCCOC]

As one embodiment of the photoresist composition, the mass ratio of the (E) base(s) to the mass of the (A) polymer preferably is 0.001-5 mass %, more preferably 0.001-2 mass %, further preferably 0.05-2 mass %, even preferably 0.10-1.0 mass %.

In addition, an (F) acid (preferably weak acid) can be used in combination with the (E) base. Through combining (E) base and (F) acid, the distribution of the (E) base in the film becomes uniform and the resolution can be improved.

Acid

The photoresist composition can further comprise (F) a single or plurality of acid. Examples of such an acid include salicylic acid, formic acid, acetic acid, propionic acid, oxalic acid, malonic acid, succinic acid, and adipic acid and the like.

As one embodiment of the photoresist composition, the mass ratio of the (F) acid(s) to the mass of the (A) polymer preferably is 0.001-5 mass %, more preferably 0.001-2 mass %, further preferably 0.01-2 mass %, even preferably 0.01-1.0 mass %, particularly preferably 0.05-1.0 mass %, more particularly preferably 0.10-1.0 mass %.

Surfactant

The photoresist composition can further comprise (G) a single or plurality of surfactant. The coatability of the photoresist composition can be improved by the (G) surfactant. Examples of the (G) surfactant that can be used for the composition according to the present invention include a nonionic surfactant, an anionic surfactant, an amphoteric surfactant, and the like.

Exemplified embodiment of (G) surfactant is KF-53 (Manufactured by Shin-Etsu Chemical Co., Ltd), but only for illustrative purpose.

As one embodiment of the photoresist composition, the mass ratio of the (G) surfactant(s) to the mass of the (A) polymer preferably is 0.001-5 mass %, more preferably 0.001-2 mass %, further preferably 0.05-2 mass %, even preferably 0.10-1.0 mass %.

Other Additives

The photoresist composition can further comprise other additive at least one selected from the group consisting of a quencher, dye, a contrast enhancer, a radical generator, and an agent for enhancing adhesion to Si containing layer (preferably substrate).

As one embodiment of the photoresist composition, the mass ratio of the other additive(s) to the mass of the (A) polymer preferably is 0.001-10 mass %, more preferably 0.001~8 mass %, more preferably 0.001-5 mass %, further preferably 0.1-5 mass %, even preferably 0.5-5 mass %, particularly preferably 0.5-2 mass %, further particularly preferably 0.50-1.0 mass %. As one aspect of the present invention, the photoresist composition comprises none (0 mass %) of this other additive(s).

Manufacturing a Photoresist Coating

As one embodiment, the present invention provides a method for manufacturing a photoresist coating, comprising: applying the photoresist composition above a single or a plurality of Si containing layer; and curing the applied photoresist composition to form the photoresist coating. In here, "above a single or a plurality of Si containing layer" comprise the photoresist coating may be formed on the Si containing layer(s) direct contact with, and interlayer may interpose between the substrate and the applied layer.

It is one preferable embodiment that the photoresist composition is applied above a single of Si containing layer (preferably a substrate). Preferable examples of those Si containing layers are silicon wafer substrate, silicon-coated substrate, silicon dioxide-coated substrate, and silicon nitride substrate.

It is also preferable embodiment that the photoresist composition is applied above a plurality of Si containing layers, photoresist composition applied above the top of the Si containing layers is more preferable. A plurality of Si containing layers can comprise plural species. Preferable examples of those Si containing layers are silicon wafer substrate, silicon-coated substrate, silicon dioxide-coated substrate, and silicon nitride substrate. Non Si containing layer (e.g., titanium-containing substrate) can be formed on or interposed between Si containing layers by known method, such as CVD.

Preferably at least one species of Si containing layer is conductive (preferably Poly-Si), and at least one species of Si containing layer is electrically insulative (preferably $SiO_2$ layer). It is preferable that fabricating conductive layer and electrically insulative layer alternately, and repeatedly. To make stairs of Si containing layers, plural etchings can be used. Thickening of the photoresist coating is desirable for such process and device (for example, 3D NAND memory). Holes can be made by etching technique (preferably dry etching), and SONO structures can be filled as electrodes.

Because the photoresist coating of the present invention can exhibit good flexibility without crack or residue as one preferable embodiment, thick coating can be made. Thickness of the photoresist coating manufactured by this method is preferably 0.5-200 μm, more preferably 1.0-100 μm, further preferably 1.0-30 μm, even preferably 5-20 μm.

Before applying the photoresist composition, a single or a plurality of Si containing layer can be pre-treated, for example by 1,1,1,3,3,3-hexamethyldisilazane solution. Known methods can be used for applying the photoresist composition, for example spin coating.

The applied resist composition can be baked (cured) to remove the solvent in the composition, thereby forming a photoresist coating. The baking temperature can vary depending on the composition to be used, but is preferably 70-160° C. (more preferably 90-160° C., further preferably 130-150° C.). It can be carried out for 10-180 seconds, preferably for 60-120 seconds in the case of on a hot plate, or for 1 to 30 minutes in case of in a hot gas atmosphere (for example in a clean oven).

An interlayer(s) may be interposed between the Si containing layer(s) (preferably a substrate) and the photoresist coating. Examples of the underlayer comprise BARC layer, an inorganic hard mask underlayer (such as a silicon oxide coating, silicon nitride coating, or silicon oxynitride coating), SOC layer, and an adhesive coating. Other layer(s) (for example, TARC) layer may be formed on the resist coating.

The photoresist coating can be exposed through a given mask. The wavelength of the light used for exposure is not particularly limited. The exposure is preferably performed with light having a wavelength of 12.0-260 nm (more preferably 13.5-248 nm). As embodiments, KrF excimer laser (wavelength: 248 nm), ArF excimer laser (wavelength: 193 nm), or extreme ultraviolet light (wavelength: 13.5 nm) can be used, and KrF excimer laser is more preferred. These wavelengths may vary within ±1%.

Post-exposure bake can be conducted following the above exposure. The temperature for the post-exposure bake is selected from the range of 80-150° C., preferably 100-140° C., and the heating time for the post-exposure bake is selected from the range of 0.3-5 minutes, preferably 0.5-2 minutes.

Development can be performed with a developer. A 2.38 mass % (±1% concentration change accepted) aqueous TMAH solution is preferred as the developer. An additive such as a surfactant can be added to the developer. The temperature of the developer is typically selected from the range of 5-50° C., preferably 25-40° C., and the development time is typically selected from the range of 10-300 seconds, preferably 30-90 seconds. As the developing method, known methods such as paddle development can be used.

After development, the photoresist patterns can be cleaned by water or cleaning solution as replacing developer with the water and/or cleaning solution. Then, the Si containing layers (preferably a substrate) can be dried, for example by a spin-dry method.

It is one embodiment of the invention that etching layer(s) under photoresist coating (preferably Si containing layer(s), more preferably substrate(s)) with the obtained photoresist patterns as a mask. For such etching, anisotropic etching is preferable, dry etching is more preferable. Example conditions of dry etching are with $O_2$, $CF_4$, $CHF_3$, $C_2$, or $BCl_3$. $O_2$ or $CF_4$ can be suitably used.

Manufacturing an Etched Photoresist Coating

As one embodiment, the present invention provides a method for manufacturing an etched photoresist coating, comprising: manufacturing the photoresist coating; exposing the photoresist coating; developing the photoresist coating; and (step 1) etching the developed photoresist coating.

This (step 1) etching can simultaneously etch uncovered portion(s) of a Si containing layer(s) below the photoresist coating. It can be said that the etching of (step 1) can comprise the etching of (step 2).

In the view point of reducing not only thickness but also width of resist patterns, isotropic etching is preferable for such etching in (step 1). Then, uncovered portions of Si containing layer(s) can be etched (preferably by anisotropic etching) in following step to make stairs.

Manufacturing an Etched Si Containing Layer(s)

As one embodiment, the present invention provides a method for manufacturing a single or plurality of etched Si containing layer, comprising: manufacturing an etched photoresist coating; (step 2) etching the Si containing layer(s).

Etching 1 or 2 Si containing layers is preferable, 2 layers is more preferable. For such etching in (step 2), anisotropic etching is preferable because uncovered portions of Si containing layers can be etched anisotropically (preferably vertical direction from the Si containing layers) to make one step of stairs.

Addition to above, repeating (step 1) and (step 2) more than 1 time(s) is preferable (5-30 times is more preferable, 5-20 time is further preferable), to make a stairs structure of Si containing layers. In this aspect, a thick photo resist coating is preferable, because etching processes are repeated. As mentioned above, the photoresist composition can make a thick photoresist coating. So, it's preferable for this aspect.

Manufacturing Devices

Subsequently, a substrate (it can be Si containing layer itself, or a substrate Si containing layers laminated on), if necessary, is further processed to form a device. Such further processing can be done by using a known method. After formation of the device, the substrate, if necessary, is cut into chips, which are connected to a leadframe and packaged with a resin. Preferably the device is a semiconductor device, solar cell chip, organic light emitting diode and inorganic light emitting diode. One preferable embodiment of the device of this invention is a semiconductor device, more preferably a semiconductor memory device.

WORKING EXAMPLES

Hereinafter, the present invention will be described with working examples. These examples are given only for illustrative purpose and not intended to limit the scope of the present invention. The term "part(s)" as used in the following description refers to part(s) by mass, unless otherwise stated.

Preparation Example 1 of Working Composition 1

Each of the components described below are prepared.

Polymer A: Random copolymer p-hydroxystyrene(60) styrene(20) tert-butyl acrylate(20) (Mw is about 12,000; 50 mass % solution in PGME solvent; Manufactured by Toho Chemical Industry Co., Ltd)

PAG A: Di(4-tert-butylphenyl)iodonium bis(perfluorobutanesulfonyl)imide (Product No. ZK-0518, Manufactured by DSP Gokyo food & chemical Co., Ltd.)

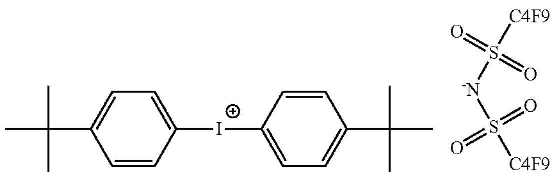

(C)-1: Poly(ethylene glycol-ran-propylene glycol) (Mn is ~2,500, Product No. 438197, Provided by Sigma-Aldrich Co. LLC)

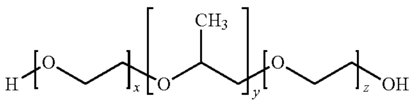

Base: Tris[2-(2-methoxyethoxy)ethyl]amine (Product No. 301248, Manufactured by Sigma-Aldrich Co. LLC)

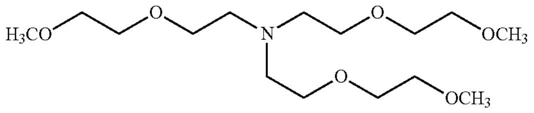

Surfactant: KF-53 (Manufactured by Shin-Etsu Chemical Co., Ltd)

As the solvent, PGME and PGMEA mixture (mass ratio of PGME/PGMEA=70/30) is used.

Each component is added to the solvent. Each ratio of PAG A, (C)-1, Base, and Surfactant are 1.6, 10, 0.15 and 0.15 mass % comparing to Polymer A as100 mass %. This 100 mass % of Polymer A is based on solid components amount. Then the solution is stirred and confirmed that all components are dissolved. The solution is mixed and the solvent is added until total solid components concentration comes to 39.0 mass %. The resultant solution is filtrated by 0.1 m capsule filter.

The obtained composition is denoted by working composition 1 in below Table 1.

Preparation Examples 2-20 of Working Compositions 2-20. And Comparative Preparation Examples 1-20 of Comparative Compositions 1-20

Preparations are carried out in the same manners as in Preparation Example 1, except for changing the (C) compound and/or its amount as described in below table 1.

Working composition 2-20 and comparative composition 1-20 are obtained.

TABLE 1

| | (C) compound | Mw | Polymer state | EO ratio | Mass % |
|---|---|---|---|---|---|
| Working comp. 1 | (C)-1 | 3,760 | Random | 80% | 10 |
| Working comp. 2 | S.A. | S.A. | S.A. | S.A. | 15 |
| Working comp. 3 | (C)-2 | 20,623 | Random | 75% | 10 |
| Working comp. 4 | S.A. | S.A. | S.A. | S.A. | 15 |
| Working comp. 5 | (C)-3 | 10,539 | Random | 57% | 10 |
| Working comp. 6 | S.A. | S.A. | S.A. | S.A. | 15 |
| Working comp. 7 | (C)-4 | | Block | 86% | 10 |
| Working comp. 8 | S.A. | | S.A. | S.A. | 15 |
| Working comp. 9 | (C)-5 | 3,795 | Block | 36% | 10 |

TABLE 1-continued

| | (C) compound | Mw | Polymer state | EO ratio | Mass % |
|---|---|---|---|---|---|
| Working comp. 10 | S.A. | S.A. | S.A. | S.A. | 15 |
| Working comp. 11 | (C)-6 | 3,626 | Block | 20% | 10 |
| Working comp. 12 | S.A. | S.A. | S.A. | S.A. | 15 |
| Working comp. 13 | (C)-7 | — | — | 80% | 10 |
| Working comp. 14 | S.A. | — | — | S.A. | 15 |
| Working comp. 15 | (C)-8 | — | — | 50% | 10 |
| Working comp. 16 | S.A. | — | — | S.A. | 15 |
| Working comp. 17 | (C)-9 | — | — | 36% | 10 |
| Working comp. 18 | S.A. | — | — | S.A. | 15 |
| Working comp. 19 | (C)-10 | — | — | 20% | 10 |
| Working comp. 20 | S.A. | — | — | S.A. | 15 |
| Compa. comp. 1 | Compa. (C)-1 | 1,000 | — | 0% | 10 |
| Compa. comp. 2 | S.A. | S.A. | — | S.A. | 15 |
| Compa. comp. 3 | Compa. (C)-2 | 2,500 | — | 0% | 10 |
| Compa. comp. 4 | S.A. | S.A. | — | S.A. | 15 |
| Compa. comp. 5 | Compa. (C)-3 | 4,914 | — | 0% | 10 |
| Compa. comp. 6 | S.A. | S.A. | — | S.A. | 15 |
| Compa. comp. 7 | Compa. (C)-4 | 8,031 | — | 0% | 10 |
| Compa. comp. 8 | S.A. | S.A. | — | S.A. | 15 |
| Compa. comp. 9 | Compa. (C)-5 | — | — | 0% | 10 |
| Compa. comp. 10 | S.A. | — | — | S.A. | 15 |
| Compa. comp. 11 | Compa. (C)-6 | — | — | 0% | 10 |
| Compa. comp. 12 | S.A. | — | — | S.A. | 15 |
| Compa. comp. 13 | Compa. (C)-7 | — | — | 0% | 10 |
| Compa. comp. 14 | S.A. | — | — | S.A. | 15 |
| Compa. comp. 15 | Compa. (C)-8 | — | — | 100% | 10 |
| Compa. comp. 16 | S.A. | — | — | S.A. | 15 |
| Compa. comp. 17 | Compa. (C)-9 | — | — | 100% | 10 |
| Compa. comp. 18 | S.A. | — | — | S.A. | 15 |
| Compa. comp. 19 | Compa. (C)-10 | — | — | — | 10 |
| Compa. comp. 20 | S.A. | — | — | — | 15 |

In Table 1, "camp." means "composition, "S.A." means "same above" and "compa." means "comparative". "mass W" means that "mass % ratio of the (C) compound(s) compare to Polymer A as 100 mass %. EO ratio is molecular ratio (mol %) of unit EO compare to combination of (unit EO and unit PO).

Same in hereinafter tables.

(C)-2: Poly(ethylene glycol-ran-propylene glycol) (Mn is ~12,000, Product No. 30438200, Provided by Sigma-Aldrich Co. LLC)

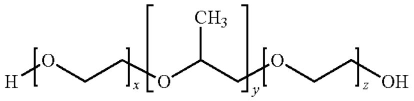

(C)-3: Poly(ethylene glycol-ran-propylene glycol) monobutyl ether (Mn is ~3,900, Product No. 438189, Provided by Sigma-Aldrich Co. LLC)

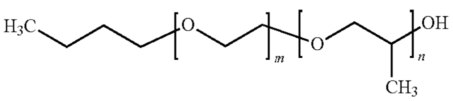

(C)-4: Poly(ethylene glycol)-block-poly(propylene glycol)-block-poly(ethylene glycol) (Mn is ~14,600, Product No. 542342, Provided by Sigma-Aldrich Co. LLC)

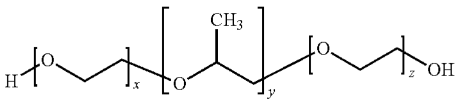

(C)-5: Poly(ethylene glycol)-block-poly(propylene glycol)-block-poly(ethylene glycol) (Mn is 2,000-3,000, Product No. SANNIX PL-2100, Manufactured by Sanyo Chemical Industries, Ltd.)

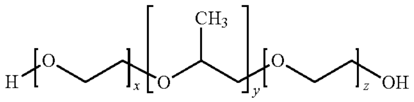

(C)-6: Poly(ethylene glycol)-block-poly(propylene glycol)-block-poly(ethylene glycol) (Mn is ~4,400, Product No. 435457, Provided by Sigma-Aldrich Co. LLC)

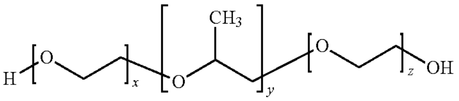

(C)-7: Mixture below 2 polymers, in which EO ratio (molecular ratio of unit EO compare to combination of (unit EO and unit PO))=80 mol %

Poly(ethylene glycol) (average Mn is 4,000, Product No. 81240, Provided by Sigma-Aldrich Co. LLC)

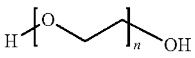

Poly(propylene glycol) (average Mn is 2,700, Product No. 202347, Provided by Sigma-Aldrich Co. LLC)

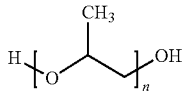

(C)-8: Mixture 2 polymers same to (C)-7, provided that changing EO ratio=50 mol % in (C)-8.

(C)-9: Mixture 2 polymers same to (C)-7, provided that changing EO ratio=36 mol % in (C)-9.

(C)-10: Mixture 2 polymers same to (C)-7, provided that changing EO ratio=20 mol % in (C)-10

Comparative (C)-1: Poly(propylene glycol) monobutyl ether (Mn is ~1,000, Product No. 438111, Provided by Sigma-Aldrich Co. LLC)

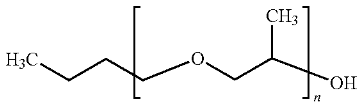

Comparative (C)-2: Poly(propylene glycol) monobutyl ether (Mn is ~2,500, Product No. 438146, Provided by Sigma-Aldrich Co. LLC)

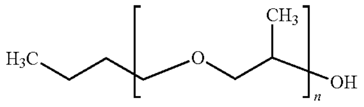

Comparative (C)-3: Poly(propylene glycol) (Mn is ~2,700, Product No. 202347, Provided by Sigma-Aldrich Co. LLC)

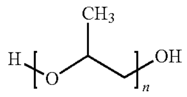

Comparative (C)-4: Poly(propylene glycol) (Mn is ~4,000, Product No. 202355, Provided by Sigma-Aldrich Co. LLC)

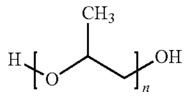

Comparative (C)-5:

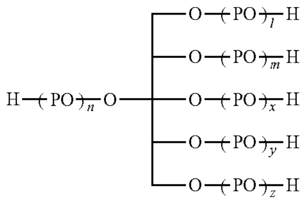

PO: Propylene oxide (Mn is 600~1,000, Product No. SANNIX SP-750, Manufactured by Sanyo Chemical Industries, Ltd.)

Comparative (C)-6:

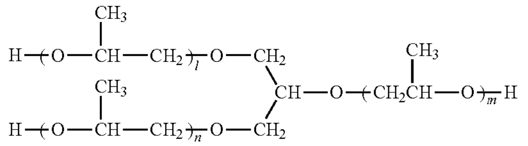

(Mn is 2,000-3,000, Product No. SANNIX GP-3000, Manufactured by Sanyo Chemical Industries, Ltd.)

Comparative (C)-7:

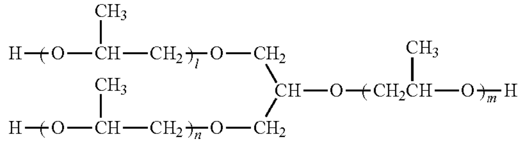

(Mn is 3,000~, Product No. SANNIX GP-4000, Manufactured by Sanyo Chemical Industries, Ltd.)

Comparative (C)-8: Poly(ethylene glycol) (average Mn is 4,000, Product No. 81240, Provided by Sigma-Aldrich Co. LLC)

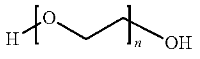

Comparative (C)-9: Poly(ethylene glycol) (average Mn is 6,000, Product No. 24-3689, Provided by Sigma-Aldrich Co. LLC)

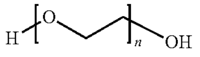

Comparative (C)-10: Lutonal M40 (Provided by BASF)

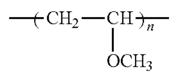

Preparation Example 21 of Working Composition 21

Polymer B described below is prepared.

Polymer B: Random copolymer p-hydroxystyrene(70) styrene(10) tert-butyl acrylate(20) (Mw is about 12,000; 50 mass % solution in PGME solvent; Manufactured by Toho Chemical Industry Co., Ltd)

Preparation is carried out in the same manners as in Preparation Example 1, except for changing the Polymer A to Polymer B. The obtained composition is denoted by working composition 21 in Table 2.

Preparation Examples 22-34 of Working Compositions 22-34 and Comparative Preparation Examples 21-24 of Comparative Compositions 21-24

Preparations are carried out in the same manners as in Preparation Example 21, except for changing the (C) compound and/or its amount as described in below table 2.

Working composition 22-34 and comparative composition 21-24 are obtained.

TABLE 2

| | (C) compound | Mw | Polyme rstate | EO ratio | Mass % |
|---|---|---|---|---|---|
| Working comp. 21 | (C)-2 | 20,623 | Random | 75% | 10 |
| Working comp. 22 | S.A. | S.A. | S.A. | S.A. | 15 |
| Working comp. 23 | (C)-3 | 10,539 | Random | 57% | 10 |
| Working comp. 24 | S.A. | S.A. | S.A. | S.A. | 15 |
| Working comp. 25 | (C)-5 | 3,795 | Block | 36% | 10 |
| Working comp. 26 | S.A. | S.A. | S.A. | S.A. | 15 |
| Working comp. 27 | (C)-7 | — | — | 80% | 10 |
| Working comp. 28 | S.A. | — | — | S.A. | 15 |
| Working comp. 29 | (C)-8 | — | — | 50% | 10 |
| Working comp. 30 | S.A. | — | — | S.A. | 15 |
| Working comp. 31 | (C)-9 | — | — | 36% | 10 |
| Working comp. 32 | S.A. | — | — | S.A. | 15 |
| Working comp. 33 | (C)-10 | — | — | 20% | 10 |
| Working comp. 34 | S.A. | — | — | S.A. | 15 |
| Compa. comp. 21 | Compa. (C)-8 | — | — | 100% | 10 |
| Compa. comp. 22 | S.A. | — | — | S.A. | 15 |
| Compa. comp. 23 | Compa. (C)-9 | — | — | 100% | 10 |
| Compa. comp. 24 | S.A. | — | — | S.A. | 15 |

Example of Preparing a Substrate for Evaluation Working Composition 1

The substrate for evaluation used for following evaluation is prepared as shown below. The surface of a silicon substrate (SUMCO Corp., 8 inches) is treated with a 1,1,1,3,3,3-hexamethyldisilazane solution at 90° C. for 60 seconds. The working composition 1 is applied thereon and spin-coated by Mark 8 (Manufactured by Tokyo Electron Limited). And the substrate is baked at 140° C. for 90 seconds. Then the photoresist coating is obtained. The thickness of the photoresist coating is 12 μm measured by a Spectrometric film thickness measurement system VM-1200 (Manufactured by SCREEN Semiconductor Solutions Co., Ltd). To make resist patterns having that 3.0 μm spaces and Space:Line=1:5, the photoresist coating on the substrate is exposed by a FPA 3000EX5 KrF stepper (Manufactuered by Canon Inc.). This substrate is post-exposure baked (PEB) at 110° C. for 90 seconds. Thereafter, the resist layer is subjected to puddle development for 60 seconds using a 2.38% tetramethylammonium hydroxide (TMAH) aqueous solution. In a state of a puddle developing solution being paddled on the substrate, pure water is started to flow onto the substrate. And with rotating the substrate, the puddle developing solution is replaced with pure water. Then, the substrate is rotated at 2,000 rpm, thereby spin-dried. It is confimed by a line width measurement system CD-SEM S-9200 (Manufactured by Hitachi Inc.) that the target resist patterns described above is obtained, and the exposure energy ($mJ/cm^2$) is shown in below Table 3 as sensitivity.

Example of Preparing Substrates for Evaluation Working Composition 2-34 And Comparative Composition 1-24

Each substrate preparation is carried out in the same manner as described above, except for changing working composition 1 with working composition 2-34 and comparative composition 1-24.

Evaluation Example of Residue by SEM

Following photoresist coatings on substrates are evaluated with a SEM instrument, SU8230 (Hitachi High-Technologies Corp.).

Evaluation criteria are designated as follows.

A: Residue is not found.

B: Residue is found.

The evaluation results were shown in below Table 3.

TABLE 3

| | (C) compound | Polymer state | EC ratio | Mass % | Sensitivity ($mJ/cm^2$) | Residue |
|---|---|---|---|---|---|---|
| Working comp. 2 | (C)-1 | Random | 80% | 15 | 206 | A |
| Working comp. 4 | (C)-2 | Random | 75% | 15 | 256 | A |
| Working comp. 6 | (C)-3 | Random | 57% | 15 | 207 | A |
| Working comp. 8 | (C)-4 | Block | 86% | 15 | 274 | A |
| Working comp. 10 | (C)-5 | Block | 36% | 15 | 202 | A |
| Working comp. 12 | (C)-6 | Block | 20% | 15 | 219 | A |
| Working comp. 14 | (C)-7 | — | 80% | 15 | 251 | A |
| Working comp. 16 | (C)-8 | — | 50% | 15 | 236 | A |
| Working comp. 18 | (C)-9 | — | 36% | 15 | 231 | A |
| Working comp. 20 | (C)-10 | — | 20% | 15 | 238 | A |
| Compa. comp. 2 | Compa. (C)-1 | — | 0% | 15 | 231 | A |
| Compa. comp. 4 | Compa. (C)-2 | — | 0% | 15 | 228 | A |
| Compa. comp. 6 | Compa. (C)-3 | — | 0% | 15 | 218 | B |
| Compa. comp. 8 | Compa. (C)-4 | — | 0% | 15 | 211 | A |
| Compa. comp. 10 | Compa. (C)-5 | — | 0% | 15 | 264 | B |
| Compa. comp. 12 | Compa. (C)-6 | — | 0% | 15 | 201 | B |
| Compa. comp. 14 | Compa. (C)-7 | — | 0% | 15 | 205 | B |
| Compa. comp. 16 | Compa. (C)-8 | — | 100% | 15 | 255 | B |
| Compa. comp. 18 | Compa. (C)-9 | — | 100% | 15 | 223 | B |

TABLE 3-continued

| | (C) compound | Polymer state | EC ratio | Mass % | Sensitivity ($mJ/cm^2$) | Resi-due |
|---|---|---|---|---|---|---|
| Compa. comp. 20 | Compa. (C)-10 | — | — | 15 | 372 | B |
| Working comp. 23 | (C)-3 | Random | 57% | 10 | 116 | A |
| Working comp. 25 | (C)-5 | Block | 36% | 10 | 119 | A |
| Working comp. 27 | (C)-7 | — | 80% | 10 | 134 | A |
| Compa. comp. 21 | Compa. (C)-8 | — | 100% | 10 | 150 | B |
| Compa. comp. 23 | Compa. (C)-9 | — | 100% | 10 | 108 | B |

As described above Table 3, residues are found in comparative composition coating substrates. All samples of EO ratio=100% are evaluated as B. Not all, but some samples of EO ratio=0% are evaluated as A. Residues are not found in working compostions coating substrates.

Evaluation Example of Crack

Following photoresist coatings on substrates are evaluated by visual check. Evaluation criteria are designated as follows.

A: No crack are found in 10 mass % or 15 mass % of (C) compound.

B: A few cracks are found in 10 mass % of (C) compound. No crack is found in 15 mass % of (C) compund.

C: Cracks are found in both 10 mass % and 15 mass % of (C) compound.

The evaluation results were shown in below Table 4.

TABLE 4

| | (C) compound | Polymer state | EO ratio | Mass % | Crack evaluation |
|---|---|---|---|---|---|
| Working comp. 1 | (C)-1 | Random | 80% | 10 | B |
| Working comp. 2 | S.A. | S.A. | S.A. | 15 | |
| Working comp. 3 | (C)-2 | Random | 75% | 10 | A |
| Working comp. 4 | S.A. | S.A. | S.A. | 15 | |
| Working comp. 5 | (C)-3 | Random | 57% | 10 | A |
| Working comp. 6 | S.A. | S.A. | S.A. | 15 | |
| Working comp. 7 | (C)-4 | Block | 86% | 10 | A |
| Working comp. 8 | S.A. | S.A. | S.A. | 15 | |
| Working comp. 9 | (C)-5 | Block | 36% | 10 | A |
| Working comp. 10 | S.A. | S.A. | S.A. | 15 | |
| Working comp. 11 | (C)-6 | Block | 20% | 10 | A |
| Working comp. 12 | S.A. | S.A. | S.A. | 15 | |
| Working comp. 13 | (C)-7 | — | 80% | 10 | B |
| Working comp. 14 | S.A. | — | S.A. | 15 | |
| Working comp. 15 | (C)-8 | — | 50% | 10 | B |
| Working comp. 16 | S.A. | — | S.A. | 15 | |
| Working comp. 17 | (C)-9 | — | 36% | 10 | B |
| Working comp. 18 | S.A. | — | S.A. | 15 | |
| Compa. comp. 1 | Compa. (C)-1 | — | 0% | 10 | C |
| Compa. comp. 2 | S.A. | — | S.A. | 15 | |
| Compa. comp. 3 | Compa. (C)-2 | — | 0% | 10 | C |
| Compa. comp. 4 | S.A. | — | S.A. | 15 | |
| Compa. comp. 5 | Compa. (C)-3 | — | 0% | 10 | C |
| Compa. comp. 6 | S.A. | — | S.A. | 15 | |
| Compa. comp. 7 | Compa. (C)-4 | — | 0% | 10 | C |
| Compa. comp. 8 | S.A. | — | S.A. | 15 | |
| Compa. comp. 11 | Compa. (C)-6 | — | 0% | 10 | C |

TABLE 4-continued

| | (C) compound | Polymer state | EO ratio | Mass % | Crack evaluation |
|---|---|---|---|---|---|
| Compa. comp. 12 | S.A. | — | S.A. | 15 | |
| Compa. comp. 15 | Compa. (C)-8 | — | 100% | 10 | A |
| Compa. comp. 16 | S.A. | — | S.A. | 15 | |
| Compa. comp. 17 | Compa. (C)-9 | — | 100% | 10 | A |
| Compa. comp. 18 | S.A. | — | S.A. | 15 | |
| Compa. comp. 19 | Compa. (C)-10 | — | — | 10 | A |
| Compa. comp. 20 | S.A. | — | — | 15 | |
| Working comp. 21 | (C)-2 | Random | 75% | 10 | A |
| Working comp. 22 | S.A. | S.A. | S.A. | 15 | |
| Working comp. 23 | (C)-3 | Random | 57% | 10 | B |
| Working comp. 24 | S.A. | S.A. | S.A. | 15 | |
| Working comp. 25 | (C)-5 | Block | 36% | 10 | B |
| Working comp. 26 | S.A. | S.A. | S.A. | 15 | |
| Working comp. 27 | (C)-7 | — | 80% | 10 | B |
| Working comp. 28 | S.A. | — | S.A. | 15 | |
| Working comp. 29 | (C)-8 | — | 50% | 10 | B |
| Working comp. 30 | S.A. | — | S.A. | 15 | |
| Working comp. 31 | (C)-9 | — | 36% | 10 | B |
| Working comp. 32 | S.A. | — | S.A. | 15 | |
| Compa. comp. 21 | Compa. (C)-8 | — | 100% | 10 | B |
| Compa. comp. 22 | S.A. | — | S.A. | 15 | |
| Compa. comp. 23 | Compa. (C)-9 | — | 100% | 10 | A |
| Compa. comp. 24 | S.A. | — | S.A. | 15 | |

As described above Table 4, cracks are found in comparative composition coating substrates. All samples of EO ratio=0% are evaluated as C. Cracks are not found in (C) compound 15 mass % working compostions coating substrates, as evaluated A or B.

Evaluation Example of Crack after Vacuum Drying

As more severe condition, following treatment and evaluation are conducted. Following photoresist coatings on substrates prepared above are further dried by vacuuming from atmospheric pressure to $6\times10^{-3}$ Pa (takes about 1-3 min).

Photoresist coatings on a substrate are evaluated by visual check. Evaluation criteria are designated as follows.

A: No crack are found in 10 mass % or 15 mass % of (C) compound.

B: A few crack are found in 10 mass % of (C) compound. No crack is found in 15 mass % of (C) compound.

C: Cracks are found in 10 mass % and 15 mass % of (C) compound.

The evaluation results were shown in below Table 5.

TABLE 5

| | (C) compound | Polymer state | EO ratio | Mass % | Crack evaluation |
|---|---|---|---|---|---|
| Working comp. 1 | (C)-1 | Random | 80% | 10 | B |
| Working comp. 2 | S.A. | S.A. | S.A. | 15 | |
| Working comp. 3 | (C)-2 | Random | 75% | 10 | B |
| Working comp. 4 | S.A. | S.A. | S.A. | 15 | |
| Working comp. 5 | (C)-3 | Random | 57% | 10 | B |
| Working comp. 6 | S.A. | S.A. | S.A. | 15 | |
| Working comp. 7 | (C)-4 | Block | 86% | 10 | B |
| Working comp. 8 | S.A. | S.A. | S.A. | 15 | |
| Working comp. 9 | (C)-5 | Block | 36% | 10 | B |
| Working comp. 10 | S.A. | S.A. | S.A. | 15 | |
| Working comp. 11 | (C)-6 | Block | 20% | 10 | C |
| Working comp. 12 | S.A. | S.A. | S.A. | 15 | |
| Working comp. 13 | (C)-7 | — | 80% | 10 | C |
| Working comp. 14 | S.A. | — | S.A. | 15 | |
| Working comp. 15 | (C)-8 | — | 50% | 10 | C |
| Working comp. 16 | S.A. | — | S.A. | 15 | |
| Working comp. 17 | (C)-9 | — | 36% | 10 | C |
| Working comp. 18 | S.A. | — | S.A. | 15 | |
| Compa. comp. 1 | Compa. (C)-1 | — | 0% | 10 | C |
| Compa. comp. 2 | S.A. | — | S.A. | 15 | |
| Compa. comp. 3 | Compa. (C)-2 | — | 0% | 10 | C |
| Compa. comp. 4 | S.A. | — | S.A. | 15 | |
| Compa. comp. 5 | Compa. (C)-3 | — | 0% | 10 | C |
| Compa. comp. 6 | S.A. | — | S.A. | 15 | |
| Compa. comp. 7 | Compa. (C)-4 | — | 0% | 10 | C |
| Compa. comp. 8 | S.A. | — | S.A. | 15 | |
| Compa. comp. 11 | Compa. (C)-6 | — | 0% | 10 | C |
| Compa. comp. 12 | S.A. | — | S.A. | 15 | |
| Compa. comp. 15 | Compa. (C)-8 | — | 100% | 10 | B |
| Compa. comp. 16 | S.A. | — | S.A. | 15 | |
| Compa. comp. 17 | Compa. (C)-9 | — | 100% | 10 | B |
| Compa. comp. 18 | S.A. | — | S.A. | 15 | |
| Compa. comp. 19 | Compa. (C)-10 | — | — | 10 | A |
| Compa. comp. 20 | S.A. | — | — | 15 | |

As (C) compounds, mixtures of unit EO polymer and unit PO polymer ((C)-7, (C)-8 and (C)-9) are evaluated as C. Copolymers of Unit EO and unit PO are mostly evaluated as B. All random copolymers are evaluated as B, whereas the EO ratio=20 mol % sample of block copolymer ((C)-6) is evaluated as C.

Preparation of Working Composition 41

To obtain 7.0 μm resist film, working composition 41 is prepared as below.

Each of the components described below are prepared.

Solvent: Mixture of PGME:nBA:DBE=60:30:10 (mass ratio).

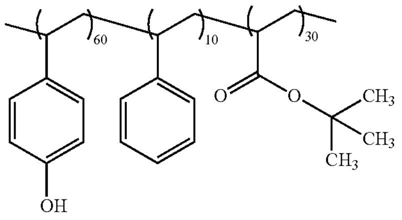

Polymer (A2), hydroxystyrene: styrene: t-butyl acrylate random copolymer, 50 mass % solution in PGME solvent, TOHO Chemical Industry, molar ratio 60:10:30, Mw about 12,000.

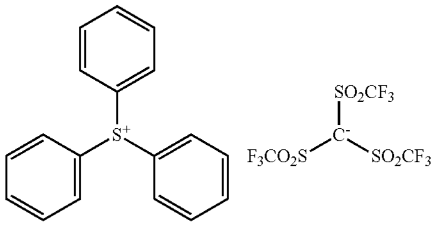

PAG (B4) TPS-$C_1$, Heraeus (C)-5 (SANNIX PL-2100). Structure described above.

Surfactant KF-53 (Shin-Etsu Chemical Co., Ltd)

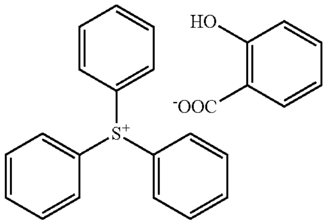

Photo active quencher, Toyo Gosei

Each component is added to the solvent. Each ratio of PAG (B4), (C)-5 (SANNIX PL-2100), Surfactant KF-53 and Photo active quencher are 0.3, 2.5, 0.1 and 0.05 mass % comparing to Polymer (A2) as 100 mass %. This 100 mass % of Polymer (A2) is based on solid components amount.

The solution is stirred for 30 min at room temperature. It is visually confirmed that all components are dissolved. The resultant solution is filtrated with 0.05 μm filter. Then, working composition 41 is obtained.

Formulation Example of Resist Film

Resist film is prepared as below.

Working composition 41 is applied on 8-inch silicon wafer by Coater Mark 8 (Tokyo Electron), and spin coated. This wafer is baked on hot plate at 150 C degree for 130 seconds, to obtain 7.0 μm resist film. Film thickness is measured by M-1210 Spectroscopic Film Thickness Measurement System (SCREEN Semiconductor Solutions).

Formulation of Resist Pattern

The resist film formulated above is exposed by KrF stepper (FPA 300-EX5, Canon). This wafer is treated post exposure bake (PEB) on hot plate at 110 C degree for 160 seconds. Resultant film is treated puddle development for 60 seconds with AZ300 MIF developer (2.38% TMAH aqueous solution, Merck Performance Materials Ltd.).

Then, resist patterns are obtained with Line=1,500 nm, Space(trench)=300 nm (Line:Space=5:1). The bottom trench width between pattern walls is 300 nm. The pattern top width can be broadened, and pattern wall can be taper shape.

The sensitivity is 82 mJ/cm$^2$. In here, the sensitivity is the exposure energy (mJ/cm$^2$).

Measurement of Resolution

It is used a mask pattern with Line:Space=5:1, space width starts from 300 nm and gradually shortened by 20 nm each. An exposure is conducted with the exposure amount which can reproduce 300 nm pattern by 300 nm slit. Stepper FPA 300-EX5 (Canon) is used.

Cross section SEM is observed to confirm pattern shape sequentially from 300 nm pattern to narrower ones. In here, resolution is the space width just before the one whose space collapse. The resolution is 280 nm.

The invention claimed is:

1. A photoresist composition comprising (A) a single or a plurality of polymer whose solubility changes under the existence of acid, (B) a single or a plurality of photo acid generator, (C) a single or a plurality of compound comprising unit EO and unit PO, and (D) a single or plurality of solvent, wherein the unit EO is represented by following formula (1), formula (1)

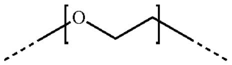

and the unit PO is represented by following formula (2)

formula (2)

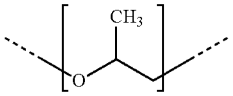

;

wherein the weight average molecular weight (Mw) of the (C) compound(s) is 1,000-50 000, the mass ratio of the (C) compound to the (A) polymer is 3-50 mass %, and the terminals of the (C) compound are modified by $R_1$— and $R_2$—O—, where $R_1$ is $C_{1-10}$ alkyl, and $R_2$ is hydrogen or $C_{1-10}$ alkyl.

2. The photoresist composition according to claim 1, wherein (C) a single or a plurality of compound is a plasticizer, and the (C) compound comprises a copolymer at least one selected from the group consisting of random copolymer, block copolymer, alternating copolymer, graft copolymer and combination of any of these.

3. The photoresist composition according to claim 1, wherein the (C) compound comprises a copolymer comprising both unit EO and unit PO, or the (C) compound is a plurality of compounds in which at least one compound comprised unit EO and at least one compound comprises unit PO.

4. The photoresist composition according to claim 1, wherein the (A) polymer comprises unit 1 represented by below formula (3), unit 2 represented by below formula (4), and/or unit 3 represented by below formula (5), formula (3)

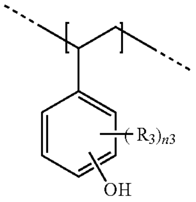

$R_3$ is each independently $C_{1-10}$ alkyl or $C_{1-10}$ alkoxyl, and n3 is 0, 1, 2, 3 or 4;

formula (4)

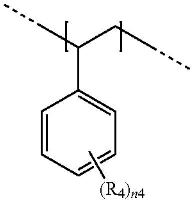

$R_4$ is each independently $C_{1-10}$ alkyl or $C_{1-10}$ alkoxyl in which —$CH_2$— can be replaced by O— and n4 is 0, 1, 2, 3, 4 or 5;

formula (5)

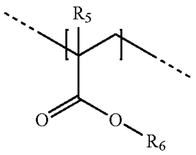

$R_5$ is hydrogen or $C_{1-10}$ alkyl, and $R_6$ is $C_{1-20}$ alkyl which optionally make hydrocarbon ring.

5. The photoresist composition according to claim 1, wherein molecular ratio of [(unit EO)/(unit PO)] in the (C) compound(s) is 10/90 to 90/10.

6. The photoresist composition according to claim 1, the (D) solvent comprises at least one selected from the group consisting of aliphatic hydrocarbon solvent, aromatic hydrocarbon solvent, monoalcohol solvent, polyol solvent, ketone solvent, ether solvent, ester solvent, nitrogen-containing solvent, and sulfur-containing solvent.

7. The photoresist composition according to claim 1, wherein the (B) photo acid generator comprises at least one selected from the group consisting of sulfonic acid derivative, diazomethane compound, onium salt, sulfone imide compound, disulfonic compound, nitrobenzyl compound, benzoin tosylate compound, iron arene complex compound, halogen-containing triazine compound, acetophenone derivative, and cyano-containing oxime sulfonate.

8. The photoresist composition according to claim 1, wherein the mass ratio of the (A) polymer to the total mass of the photoresist composition is 5-50 mass %, the mass ratio of the (B) photo acid generator to the mass of the (A) polymer is 0.10-8 mass %, and the mass ratio of the (C) compound to the mass of the (A) polymer is 0.1-50 mass %.

9. The photoresist composition according to claim 1, further comprising at least one additive selected from the group consisting of a quencher, a surfactant, dye, a contrast enhancer, acid, base, a radical generator, and an agent for enhancing adhesion to substrates.

10. A method for manufacturing a photoresist coaling, comprising:

applying the photoresist composition according to claim 1 above a single or a plurality of Si containing layer; and curing the applied photoresist composition to form the photoresist coating.

11. The method for manufacturing a photoresist coating according to claim 10, wherein the photoresist composition is applied above a plurality of Si containing layers, the Si containing layers comprise plural species, at least one species of Si containing layer is conductive, and at least one species of Si containing layer is electrically insulative.

12. The method for manufacturing a photoresist coating according to claim 10, wherein the thickness of the photoresist coating is 0.5-200 μm.

13. A method for manufacturing an etched photoresist coating, comprising:

manufacturing the photoresist coating according to claim 10;

exposing the photoresist coating;

developing the photoresist coating; and (step 1) etching the developed photoresist coating.

14. A method for manufacturing a single or plurality of etched Si containing layer, comprising:

manufacturing an etched photoresist coating according to claim 13; and (step 2) etching the Si containing layer(s).

15. The method for manufacturing a single or plurality of etched Si containing layer according to claim 14, further comprising repeating (step 1) and (step 2) more than 1 time(s) wherein the etching of (step 1) is isotropic etching, and the etching of (step 2) is anisotropic etching.

16. A method for manufacturing devices comprising the method according to claim 10.

17. The method for manufacturing devices according to claim 16, further comprising forming wirings in the devices.

18. The photoresist composition according to claim 1, wherein the (C) compound only contains carbon, hydrogen and oxygen.

19. The photoresist composition according to claim 4, wherein the polymer (A) is a copolymer comprising unit 1, unit 2, and unit 3.

20. The method for manufacturing a photoresist according to claim 12, wherein the thickness of the photoresist coating is 5-200 μm.

* * * * *